(12) United States Patent
Wong et al.

(10) Patent No.: US 6,330,185 B1
(45) Date of Patent: Dec. 11, 2001

(54) HIGH BANDWIDTH MULTI-LEVEL FLASH MEMORY USING DUMMY MEMORY ACCESSES TO IMPROVE PRECISION WHEN WRITING OR READING A DATA STREAM

(75) Inventors: Sau C. Wong, Burlingame; Hock C. So, Redwood City, both of CA (US)

(73) Assignee: Multi Level Memory Technology, San Jose, CA (US)

( * ) Notice: Subject to any disclaimer, the term of this patent is extended or adjusted under 35 U.S.C. 154(b) by 0 days.

(21) Appl. No.: 09/768,922

(22) Filed: Jan. 23, 2001

Related U.S. Application Data

(62) Division of application No. 09/434,588, filed on Nov. 5, 1999.

(51) Int. Cl.[7] .................................................... G11C 11/34
(52) U.S. Cl. ........................................ 365/185.03; 365/233
(58) Field of Search ................................. 365/233, 185.03

(56) References Cited

U.S. PATENT DOCUMENTS

| | | | |
|---|---|---|---|
| Re. 35,934 | 10/1998 | Takai | 365/185.03 |
| 4,597,061 | 6/1986 | Cline et al. | 365/189 |
| 5,341,341 | 8/1994 | Fukuzo | 365/233 |
| 5,426,606 | 6/1995 | Takai | 365/189.05 |
| 5,666,305 | 9/1997 | Mihara et al. | 365/145 |
| 5,680,341 | 10/1997 | Wong et al. | 365/145 |
| 5,682,352 | 10/1997 | Wong et al. | 365/201 |
| 5,694,356 | 12/1997 | Wong et al. | 365/185.03 |
| 5,745,409 | 4/1998 | Wong et al. | 365/185.03 |
| 5,748,533 | 5/1998 | Dunlap et al. | 365/185.19 |
| 5,748,534 | 5/1998 | Dunlap et al. | 365/185.21 |
| 5,801,980 | 9/1998 | Wong et al. | 365/45 |
| 5,815,425 | 9/1998 | Wong et al. | 365/45 |
| 5,818,757 | 10/1998 | So et al. | 365/185.18 |
| 5,896,340 | 4/1999 | Wong et al. | 365/230.03 |
| 5,909,387 | 6/1999 | Wong et al. | 365/45 |
| 5,909,449 | 6/1999 | So et al. | 371/21.4 |
| 5,923,585 | 7/1999 | Wong et al. | 365/185.03 |
| 5,943,283 | 8/1999 | Wong et al. | 365/230.01 |
| 5,949,716 | 9/1999 | Wong et al. | 365/185.29 |
| 5,969,986 | 10/1999 | Wong et al. | 365/185.03 |
| 6,038,166 | 3/2000 | Wong | 365/185.03 |
| 6,058,060 | 5/2000 | Wong | 365/218 |
| 6,091,660 | * 7/2000 | Sasaki et al. | 365/230.03 |
| 6,130,841 | 10/2000 | Tanaka et al. | 365/185.22 |
| 6,134,141 | 10/2000 | Wong | 365/185.03 |
| 6,134,145 | 10/2000 | Wong | 365/185.22 |
| 6,151,246 | 11/2000 | So et al. | 365/185.09 |
| 6,208,542 | 3/2001 | Wang et al. | 365/45 |

* cited by examiner

Primary Examiner—David Nelms
Assistant Examiner—M. Tran
(74) Attorney, Agent, or Firm—David T. Millers

(57) ABSTRACT

A multi-level non-volatile memory includes one or more arrays of memory cells including storage cells and dummy cells. The memory observes or measures write operations that write dummy values to the dummy cells and from the observations or measurements selects parameters such as programming voltages or the duration of program cycles. The selection of parameters optimizes write precision within the available access time of a high bandwidth memory. Accessing dummy cells also allows the memory to reach a steady state before writing or reading of data begins. In particular, multiple pipelines sequentially start write operations, and writing of data begins when an equilibrium number of pipelines are performing write operations. Similarly, multiple read operation start before the reading of data for actual use. The stabilization is particularly critical when the pipelines share a power source.

12 Claims, 8 Drawing Sheets

HIGH BANDWIDTH MULTI-LEVEL FLASH MEMORY USING DUMMY MEMORY ACCESSES TO IMPROVE PRECISION WHEN WRITING OR READING A DATA STREAM

CROSS-REFERENCE TO RELATED PATENT APPLICATION

This is a divisional of U.S. patent application Ser. No. 09/434,588, filed on Nov. 5, 1999.

BACKGROUND

1. Field of the Invention

This invention relates to architectures and methods for writing a data set to and reading a data set from a non-volatile semiconductor memory such as a Flash memory.

2. Description of Related Art

Portable systems often use non-volatile semiconductor memory such as Flash memory for data storage. Such solid-state memories are compact, low cost, have low power requirements, and can retain data without any applied power. Some recent advances in non-volatile memory have been in multi-level non-volatile memories. Multi-level non-volatile memories store multiple digital bits of information or an analog level/value in each memory cell. Accordingly, multi-level non-volatile memories store more data per IC chip area and have lower cost per bit of data storage than do binary non-volatile memory. However, write and read operations for multi-level non-volatile memories are often slower than write and read operations in binary memories. Accordingly, the bandwidth or data rate for write and read operations in multi-level non-volatile memory may be insufficient for some applications.

One exemplary use of non-volatile memory is in a "digital" (or solid state) camera. A digital camera contains an imaging system that records or stores images as pixel data (i.e., an array of pixel values) in semiconductor memory. Each pixel value indicates a color of a small area (or pixel) in an image and can be stored in digital or analog form, depending on the type of semiconductor memory. When a picture is taken, the camera nearly instantaneously has a large quantity of pixel data to store. A record operation writes the pixel values to the memory array. Ideally, the bandwidth for writing to the memory is high enough to store an image as the pixel values are generated from or by the image sensor (CCD or CMOS) or at least before a user wants to take another picture. For recording of video images, the bandwidth for write operations of the memory must be sufficiently high to record one image after another at the frame rate of the video image. Downloading an image from the camera requires reading pixel values out of the memory a rate selected for data transfer.

Audio recording in a non-volatile memory stores a data series made of audio samples. Again, the bandwidth of the non-volatile memory must be high enough to store the audio samples at the sampling rate of the audio. Playing back the audio requires reading the samples at the sampling rate and converting the series of samples to a continuous audio signal. High quality audio recording generally requires a high sampling rate and memories with corresponding bandwidths. For CD quality audio recording and playback, the write and read bandwidths should match a sampling frequency of about 44 kHz.

U.S. Pat. No. 5,680,341, entitled "Pipelined Record and Playback for Analog Non-Volatile Memory"; U.S. Pat. No. 5,969,986, entitled "High-Bandwidth Read and Write Architecture for Non-Volatile Memories"; U.S. patent application Ser. No. 09/128,225, entitled "High Data Rate Write Process for Non-volatile Flash Memories"; and U.S. patent application Ser. No. 09/224,656, entitled "Dynamic Write Processes for High Bandwidth Multi-Bit-Per-Cell and Analog/Multi-Level Non-Volatile Memories", which are hereby incorporated by reference in their entirety, describe use of pipelined memory accesses to achieved a high bandwidth data accesses in non-volatile memories.

A primary concern in multi-level non-volatile memory is the precision with which values are written and read. In particular, the precision with which write or read processes can set or determine a threshold voltage in a multi-bit-per-cell non-volatile memory cell determines the number of distinguishable values or states (e.g., the number of bits) that the non-volatile memory cell can store and retrieve. The write and read precision in an analog memory similarly determines the storage error and how accurately different analog levels can be reproduced. For optimal precision during a write and read operation, the voltage sources and operating conditions of the memory should be stable.

Writing of a threshold voltage generally achieves maximum precision by using the maximum available time for the write operation. One process for writing a multi-level (i.e., multi-bit or analog) value includes iterative program cycles and verify cycles. During each program cycle, the write process applies programming voltages to the source, drain, and control gate of a floating gate transistor in a selected memory cell. The programming voltages change the threshold voltage in the memory cell, for example, by channel hot electron injection. During each verify cycle, the write process determines whether the threshold voltage in the memory cell has reached a target threshold voltage corresponding to a multi-level value being written. This write process can distinguish two target threshold voltages (and corresponding multi-level values) if the difference in the target threshold voltages is greater than the threshold voltage change during a single program cycle. Accordingly, to maximize precision, the change in threshold voltage per program cycle should be minimized. Short program cycles and a low gate voltage, selected for example according to the target threshold voltage, can decrease change in threshold voltage per program cycle. However, the number of program and verify cycles and the total write time increase as the threshold voltage change per program cycle decreases. The available write time or the required write bandwidth thus limits the number of program cycles and the minimum threshold voltage change per program cycle.

Ideally, the change per program cycle is such that the maximum number of program and verify cycles required during a write takes all of (but not more than) the available times for a write operation. This is difficult to achieve because memory cells may vary from one array to the next and from one chip to the next. Accordingly, memory cells do not respond in the same fashion to program cycles. Further, a memory cell's response to a program cycle changes over the life of the memory cell because of charge-trapping around a floating gate in the memory cell. Accordingly, designers of multi-level non-volatile memories have chosen write voltages and program cycles that satisfy expected conditions during the life of a non-volatile memory. However, the chosen write voltages and program cycles often fail to provide optimum precision in the available write time.

Makers of non-volatile memory are now striving to achieve maximum write and read precision in the short times available in high bandwidth multi-level nonvolatile memories.

SUMMARY

In accordance with an aspect of the invention, a multi-level non-volatile memory includes one or more arrays of memory cells with each array including one or more dummy cells. Measurements of write operations to the dummy cells indicate the reaction that the memory cells have to the programming voltages. After, writing to one or more dummy cells, the parameters such as the programming voltages or the duration of program cycles are adjusted to optimize the precision of a write operation in the available write time.

In accordance with another aspect of the invention, a multi-level non-volatile memory includes multiple arrays of memory cells and pipelined memory accesses to achieve a high bandwidth I/O processes for data streams. A shared charge pump or other shared voltage source provides uniformity for a write or read voltage used when accessing memory cells in the arrays. To improve stability of record and playback operations, each array includes at least one dummy memory cell, and pipelined access of storage cells begins by accessing the dummy cells. Writing or reading of actual data does not begin until reaching a steady state where the shared charge pump or voltage supply is driving a constant number of pipelined operations in various stages. Similarly, when ending a record or playback operation, the memory continues accessing (writing or reading) dummy information so that accesses of actual data finish while the memory is still driving the constant number of pipelined operations.

The access of the dummy information also tests the performance or response of memory cells. Based on the test results, the memory selects parameters such as read or write voltages and/or program cycle times to maximize precision of the write, record, read, or playback operation within the time restrictions on the operation. Thus, the memory achieves better performance than would be possible using fixed voltages or timing established according to the estimated characteristics of the non-volatile memory.

One specific embodiment of the invention is a multi-level non-volatile memory including an array of non-volatile memory cells, a write circuit, a measurement circuit, and a selection circuit. The write circuit applies programming voltages to program memory cells in the array. The measurement circuit measures a programming of a selected memory cell, for example, a dummy cell, and the selection circuit selects programming parameters for subsequent write operations according to the measurement of the programming of the selected memory cell. The measurement circuit may include a counter coupled to count a number of program cycles required to program the selected memory cell to a target level.

The memory may further include multiple pipelines each including an array of non-volatile memory cells, a write circuit, a measurement circuit, and a selection circuit. A timing circuit coupled to the pipelines sequentially starts the pipelines on write operations that make up a record operation. In one embodiment, the record operation includes: a first set of write operations during which the write circuits program dummy values into dummy cells and the measurement circuits measures programming of the dummy cells; and a second set of write operations during which the write circuits write data to storage cells using the programming parameters that the selection circuit selects. The record operation may further include a third set of write operations during which the write circuits program dummy values into dummy cells. The first and third sets of write operation stabilize the voltage levels and the current drawn for all of the write operations to the storage cells.

In accordance with another specific embodiment of the invention, a multi-level non-volatile memory includes a plurality of pipelines, a timing circuit, and optionally a charge pump or other shared power supply coupled to provide a programming voltage to all of the pipelines. Each pipeline includes: an array of non-volatile memory cells and a write circuit. The write circuit applies programming voltages to program selected memory cells. The timing circuit sequentially starts the pipelines on write operations for recording a data set. Typically, record operation includes: a first set of write operations during which the write circuits program dummy values into dummy cells; and a second set of write operations during which the write circuits write data to storage cells. A first of the second set of write operations begins while at least one write operation in the first set is in progress. The recording may further include a third set of write operations during which the write circuits program dummy values into dummy cells. The first of the third set of write operations begins while at least one operation in the second set is in progress.

In accordance with yet another embodiment of the invention, a write process includes: writing a dummy value to a dummy cell in a multi-level non-volatile memory; observing a response of the dummy cell to the writing; and selecting programming parameters for a subsequent write operation according to the response observed. The writing of the dummy value generally includes applying programming voltages to the dummy cell during a series of program cycles and determining whether the dummy cell has reached a state corresponding to the dummy value. The observing of the response counts the program cycles needed to reach the state corresponding to the dummy value. The write operation can achieve greater precision using the parameters selected according to the measured performance of the dummy cell.

A record or playback process in accordance with the invention includes a first set of memory accesses and a second set of memory accesses. Each access in the first set is a dummy access that causes a corresponding pipeline to access (write or read) a dummy value typically in a dummy cell of a memory array associated with the pipeline. Each access in the second set corresponds to a data value and a storage cell in a memory array of a corresponding one of the pipelines. A first of the pipelines starts on a first access from the second set while one or more accesses in the first set are in progress in the other pipelines. Accordingly, accesses in the second set (i.e., accesses corresponding to actual data) can be limited to times when the memory performs a fixed number of simultaneous pipelined memory accesses. Voltages in the memory during data accesses are more stable than would be the case in a memory that begins data accesses without any preceding dummy accesses.

BRIEF DESCRIPTION OF THE DRAWINGS

Use of the same reference symbols in different figures indicates similar or identical items.

DETAILED DESCRIPTION

In accordance with an aspect of the invention, a multi-level non-volatile memory including multiple pipelines accesses dummy values in dummy cells to stabilize the environment inside the memory, for write and read operations that access data in storage cells. More specifically, the dummy access can stabilize environmental properties such as external and internal (on-chip) generated voltage levels, the band-gap reference voltage level, and even the ground level within the memory. Writing to the dummy cells also evaluates memory cell response to programming. The memory can adjust programming parameters according to the evaluation and thereby improve the accuracy of write operations.

Figure 1:
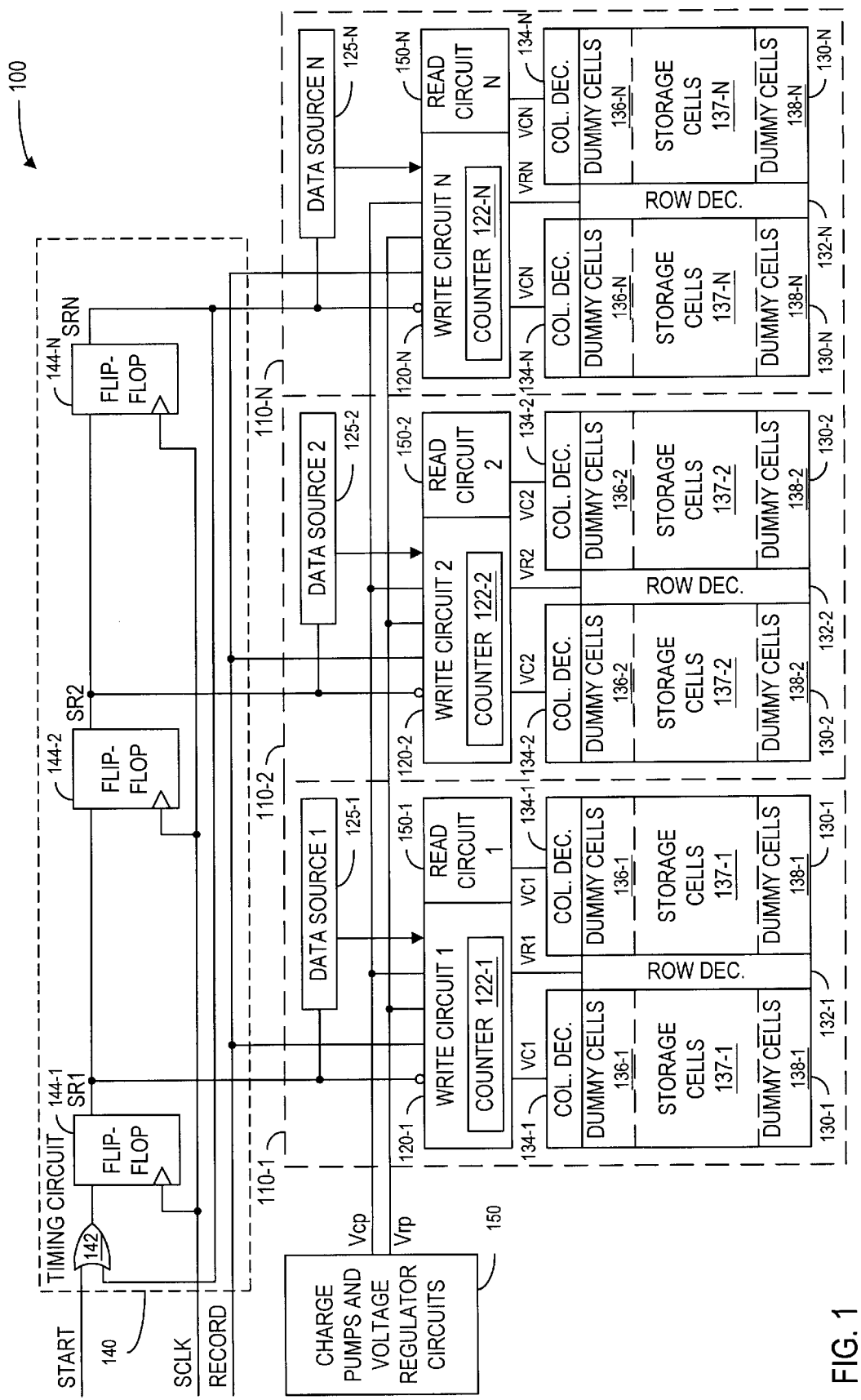
FIG. 1 is a block diagram of a memory in accordance with an embodiment of the invention.

FIG. 1 is a block diagram of a multi-level non-volatile memory 100 in accordance with an embodiment of the invention. Memory 100 includes multiple arrays 130-1 to 130-N of memory cells in respective pipelines 110-1 to 110-N. Pipelines 110-1 to 110-N and memory arrays 130-1 to 130-N are sometimes referred to herein as pipelines 110 and arrays 130. Although FIG. 1 shows three pipelines 110, memory 100 can include any number N of pipelines. The number of pipelines provided determines the number of simultaneous write or read operations memory 100 conducts. An operation that writes a data stream to memory 100 is referred to herein as a record operation. For recording of a data stream, a timing circuit 140 sequentially starts pipelines 110 on write operations at a data rate R, and pipelines 110 operate individually to complete the write operations. As indicated in Equation 1, the number N of pipelines 110 and the desired data rate R for writing data to memory 100 controls the maximum write time Ttot available to each pipeline 110 for a write operation.

$$Ttot = N/R \quad \text{Equation 1}$$

An operation that reads a data stream from memory 100 is referred to herein as a playback operation and is under restrictions similar to those placed on a record operation. In particular, the data rate or bandwidth required for playback operations limits the available time for each read operation in the respective pipelines 110.

Each non-volatile memory array 130 is a multi-level non-volatile memory array. Such memory arrays are known for storing an analog value or a multi-bit digital value in each memory cell. Each array 130 includes rows and columns of memory cells, where each memory cell is, for example, a single floating gate transistor, a split gate transistor, or a multiple-transistor memory cell. In an exemplary embodiment of the invention, memory 100 is a Flash memory containing sectors of memory cells, and each memory cell consists of a single industry-standard N-channel floating gate transistor. In the exemplary embodiment, the memory cells are categorized as storage cells 137 or dummy cells 136 or 138. Each sector contains both storage cells and dummy cells. During erasing, all memory cells in the same sector are erased together. The storage and dummy cells are substantially identical and differ in their use as described further below. Row decoders 132-1 to 132-N split respective memory arrays 130-1 to 130-N into left and right arrays. The splitting of memory array 130 effectively creates separate left and right arrays and allows erasing of a sector in the one side (left or right) while programming the other side (right or left). In each array 130, each row contains only storage cells 137 or only dummy cells 136 or 138. Control gates of the memory cells in a row of an array 130 couple to a row line associated with the row. Drains of the memory cells in a column of an array 130 couple to a column line associated with the column, and sources of the memory cells in an erase sector of an array 130 couple to a source line associated with the sector. Each sector of the exemplary embodiment contains one or more columns of memory cells. Alternative memory architectures may use different kinds of sector schemes, for example, sectors that are row-based instead of column-based. With row-based sectors, the dummy cells 136 and 138 are arranged in columns. Another alternative memory architecture may use a different array partitioning scheme, allowing one single memory array instead of left and right arrays.

Memory arrays 130-1 to 130-N are separate in that a write or read operation in one array 130-$i$ does not directly affect operations in other arrays 130-$j$. For a write or read operation, a row decoder 132 receives a row address signal, selects a row line in the associated array 130, and conveys bias voltages a write circuit 122 or a read circuit 150 to the selected and unselected row lines in the associated array. The associated column decoder 134 receives a column address signal, selects a column line in the associated array 130 and conveys bias voltages to the selected and unselected column lines in the associated array.

Memory 100 can perform a record operation for writing (or recording) a data stream, for example, an array of pixel values representing an image, a series of samples representing a sound signal, or a continuous stream of multi-bit data, which may be encoded or not encoded. The record operation cyclically writes input data values to memory arrays 130-1 to 130-N. For the record operation, a timing circuit 140 cyclically asserts signals SR1 to SRN to start write circuits 120-1 to 120-N in pipelines 110-1 to 110-N on write operations. Each write circuit 120 responds to being started according to a current mode of the write circuit. In particular, each write circuit 120 has an idle mode, an initial mode, a data mode, and an end mode. The write circuit 120 writes to dummy cell 136 and 138 in the initial and end modes, respectively. The write circuit 120 writes to a storage cell 137 in the data mode.

The structures of write circuits 120 and data sources 125 depend on the type of data values being stored in the associated memory array. In one embodiment, multi-level memory 100 is an analog memory, and data sources 125-1 to 125-N are sample-and-hold circuits that sample an input analog signal at rising edges of the associated signals SR1 to SRN. U.S. Pat. No. 5,680,341 to Wong et al., which is hereby incorporated by reference in its entirety, describes analog memories with multiple read/write pipelines and describes use of sample-and-hold circuits, read circuits, and write circuits for analog memories.

In another alternative embodiment, multi-level memory 100 is a multi-bit-per-cell memory. For a multi-bit-per-cell memory, each data source 125 can include latches, flip-flops, or volatile memory cells (e.g., SRAM or DRAM cells) that temporarily hold digital data bits for writing to the selected non-volatile memory cell in the associated array 130. A digital-to-analog translator converts the digital data bits to an analog value that a sample-and-hold circuit temporarily stores as described for analog memory. When a signal SRi starts a write circuit 120-$i$, the write circuit 120-$i$ generates write signals VRi and VCi, which row decoder 132-$i$ and column decoder 134-$i$ respectively apply to the selected row and column lines to write a value to a selected memory cell. The write operation proceeds as a series of program cycles and verify cycles.

For program cycles in a pipeline 110-$i$, write circuit 120-$i$ generates row signal VRi and column signal VCi at high voltages respectively derived from voltages Vrp and Vcp. (Typically, voltage Vrp is about 9 to 12 volts, and voltage Vcp is about 5 to 6 volts.) Individual write circuits 120-1 to 120-N can select the voltage of signal VRi or VCi according to the value being written in the associated array. For example, the chosen voltages of signal VRi or VCi can be proportional to the input data value. In accordance with an aspect of the invention, a shared charge pump or other power supply 150 generates voltage Vcp and Vrp for all of the write circuits 120-1 to 120-N. Voltages Vrp and Vcp are typically greater than the power supply voltage Vcc (typically about 3 V) for the chip. The combination of a grounded source line, voltage Vcp being applied to the selected row line, and voltage VRi being applied to the selected column line induces channel hot electron injection in the selected memory cell, which increases the threshold voltage of the selected memory cell. Write circuit 120-$i$ continues the program cycle for a period Tp that can be dynamically selected as described below.

For verify cycles, signal VRi is at a verify voltage, which is typically proportional to the input data value. Signal VCi is at a read voltage level (about 1 volt), and a sense amplifier (not shown) senses whether the selected memory cell conducts. (Write circuit 120-$i$ can share the sense amplifier with read circuit 150-$i$) If the selected memory cell does not conduct during the verify cycle, the threshold voltage of the selected memory cell is equal to or greater than the voltage level of signal VRi, and the write operation is complete. As a result, the final threshold voltage of the selected memory cell will be equal to or slightly greater than the verify voltage, and will be proportional to the input data value. The threshold voltage change per program cycle at the end of a write operation determines the maximum difference between the ending threshold voltage and the target threshold voltage. Accordingly, minimizing the threshold voltage change per program cycle near the end of a write operation maximizes precision.

Timing circuit 140 starts and controls the record and playback operations in pipelines 110. In the exemplary embodiment of the invention, timing circuit 140 includes N flip-flops 144-1 to 144-N that are connected in a ring configuration to operate as a shift register. Flip-flops 144-1 to 144-N respectively correspond to pipelines 110-1 to 110-N and cyclically start corresponding write circuits 120-1 to 120-N on write operations or read circuits 150-1 to 150-N on read operations at falling edges of output signals SRl to SRN. Before a record or playback operation, all of flip-flops 144-1 to 144-N are reset.

Before a record operation, the sectors that will hold the data stream are erased so that storage cells 137 and dummy cells 136 and 138 are in a low threshold voltage state. Write circuits 120-1 to 120-N are all in the idle mode immediately before the beginning of a record operation. At the beginning of the record operation, memory control circuitry (not shown), which may be internal or external to an IC containing memory 100, asserts a signal RECORD, which remains asserted until timing circuit 140 starts the write operation for a last data value of a data stream. When signal RECORD is asserted, signal START is asserted for one clock period of a clock signal SCLK, and at the rising edge of signal SCLK that occurs during this period, flip-flop 144-1 asserts signal SRl high. Timing circuit 140 sequentially asserts and deasserts signals SR1 to SRN at a rate that clock signal SCLK controls. The rate matches the bandwidth or write frequency required of memory 100.

When signals RECORD and SNi are asserted to a write circuit 120-$i$ that is in the idle mode, the write circuit 120-$i$ transitions to the initial mode and begins a write operation to a dummy cell 136-$i$ in the associated array 130-$i$. In the initial mode, a write circuit 120 writes a predetermined dummy value using default programming parameters. The write operation proceeds as a series of program cycles and verify cycles. During each program cycle, write circuit 120-$i$ applies the default programming voltages to the selected row, column, and source lines corresponding to a selected one of dummy cells 136-$i$, and the threshold voltage of the selected dummy cell increases. During each verify cycle, write circuit 120-$i$ determines whether the threshold voltage of the dummy cell is above a target level representing the dummy value being written. The write operation ends when the threshold voltage of the cell reaches or exceeds the target level. A counter 122-$i$ in the write circuit 120-$i$ counts the number of program cycles required to reach the target level during the write operation in the initial mode. A low or high count at the end of the write operation indicates that the dummy cell changes relatively rapidly or slowly in response to the default programming parameters. As described further below, memory 100 uses the counts in counters 122-1 to 122-N to select the programming parameters for use in write operations when write circuits 120-1 to 120-N are in the data mode. Examples of the programming parameters include: the programming voltages applied to the selected row, column, and source lines; the duration of each program cycle; the resistance of the programming load-line at the drain of the selected memory cell, and the mapping between data values and target threshold voltages.

When signals RECORD and SNi are asserted to a write circuit 120-$i$ that is in the initial mode and has completed writing of the last assigned dummy value, the write circuit 120-$i$ transitions to the data mode and begins a write operation to a storage cell 137-$i$ in the associated array 130-$i$. In particular, write circuit 120-$i$ receives a data value (multi-bit or analog) from data source 125-$i$ and generates signals VRi and VCi. The associated row and column decoders 132-$i$ and 134-$i$ apply respective signals VRi and VCi to row and column lines coupled to the selected storage cell in the associated array 130-$i$. During program cycles, signals VRi and VCi have the programming voltages for the data value. The programming voltages or other programming parameters also depend on a measured count Cm in counters 122-1 to 122-N. In particular, a low count Cm indicates that the memory cells are programming quickly, and memory 100 adjusts the programming parameters for the data mode write operations to reduce the programming speed and improve the accuracy of write operations. Typically, each write circuit 120-$i$ selects the programming parameters according to the count in the associated counter 122-$i$, but alternatively a global choice of programming voltage can be made based on all counts in counters 122-1 to 122-N.

Write circuits 120 remains in the data mode as long as signal RECORD remains asserted. Each time timing circuit 140 asserts signal SRi while signal RECORD remains asserted, the associated write circuit 120-$i$ writes a data value to the next available storage cell 137-$i$ in the associated memory array 130-$i$. If signal RECORD is not asserted when timing circuit 140 asserts signal SRi to a write circuit 120-$i$ that is in the data mode, the write circuit 120-$i$ transitions to the end mode and begins a write operation to a dummy cell 138-$i$ in the associated array 130-$i$. When in the end mode, each write circuit 122-$i$ ignores subsequent assertions of signal SRi, so that in the end mode, write circuits 122 write at most one dummy value in one dummy cell 138, of each array 130. Resetting flip-flops 144-1 to 144-N stops timing circuit 140.

Figure 2A:
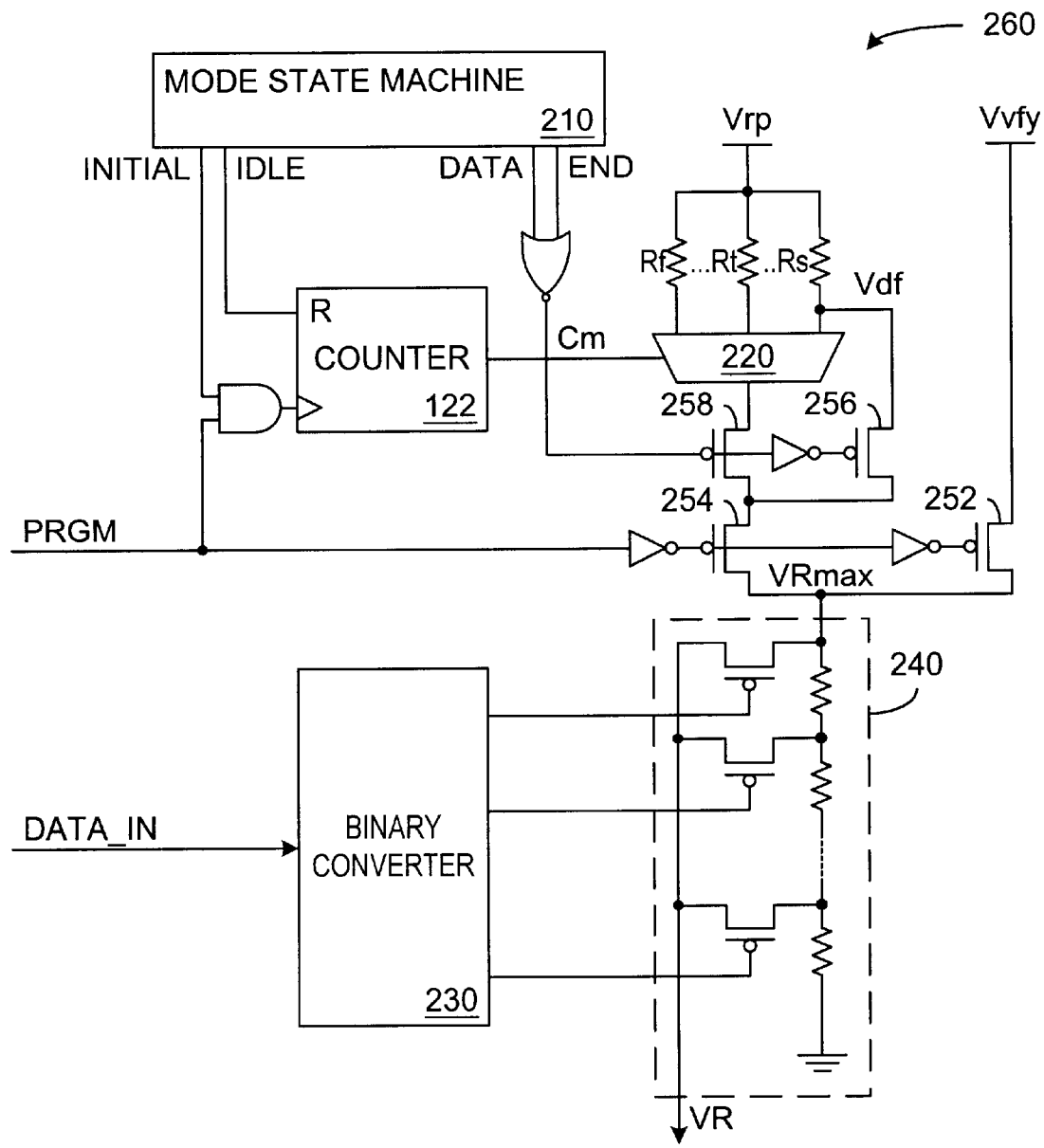
FIGS. 2A, 2B, 2C and 2D show portions of write circuits that, in accordance with an embodiment of the invention, selects programming parameters according to measured programming response.

One adjustable programming parameter is the voltage level of a row line signal VR for an array 130 when writing a data value. For example, the measured count Cm can select an upper limit to a range of row line programming voltages, while the data value selects a value within the range. FIG. 2A illustrates a portion 260 of a write circuit 120 that selects a row line programming voltage for signal VR when writing a multi-bit data value to a memory cell. In FIG. 2A, the counter 122 of write circuit 120 couples to a multiplexer that selects a maximum voltage level for signal VR when write circuit operates in data or end mode. A mode state machine 210 asserts one of signals IDLE, INITIAL, DATA, or END to indicated the current mode of write circuit 120.

In the idle mode, mode state machine 210 resets counter 122. In the initial mode, mode state machine 210 enables counter to count cycles of a signal PRGM. During a write operation, signal PRGM is asserted (high) during program cycles and is deasserted (low) during verify cycles. Signal PRGM stops oscillating when a write operation is complete. Thus, using signal PRGM as a clock signal for counter 122 causes counter 122 to count the number of program cycles required for the write operation. In data and end modes, state machine 210 disables counting, and counter 122 holds the count from the initial mode.

During a verify cycle in any of the modes, signal PRGM turns on a transistor 252 to connect a voltage Vvfy to a voltage divider 240. Voltage divider 240 selects a voltage level for signal VRi according to the level of the input voltage VRmax, which is voltage Vvfy for a verify cycle, and according to a data value that signal DATA_IN represents. In particular, voltage divider 240 includes a set of series connected resistors with taps between the resistors, and a binary converter 230 selects which tap provides signal VR. During a program cycle, a transistor 254 connects a maximum programming voltage to voltage divider 240. In the initial mode, the maximum programming voltage is a default voltage Vdf conveyed via a transistor 256. In data or end mode, the maximum programming voltage is the voltage that the count in counter 122 causes multiplexer 220 to select. In the embodiment of FIG. 2A, resistors Rf, Rt, and Rs connect voltage Vrp from a shared charge pump to input terminals of multiplexer 220. Resistor Rf has a resistance larger than the resistance of resistor Rt, and the resistance of resistor Rt is larger than the resistance of resistor Rs.

For optimal precision, the time required for program and verify cycles that program the selected memory cell to the target threshold voltage should occupy all of the available time Ttot. Equation 2 indicates an optimal count Co of program cycles when the default time per program cycle is Tp and the time per verify cycle is Tv.

$$Co = Ttot/(Tp+Tv) \qquad \text{Equation 2}$$

If the measured count Cm per write operation is lower than the optimal count Co, the memory cell programs faster than desired. In response, multiplexer 220 selects a lower programming voltage so that each program cycle increases the threshold voltage less, and more program cycles are required. Accordingly, the count of program cycles will be closer to the optimal count.

In FIG. 2A, the default programming voltage Vdf is at a relatively high voltage that programs memory cells with slow programming characteristics to a target threshold voltage within the maximum allowable number of program cycles. Accordingly, typical memory cells and fast-programming memory cells will reach the target threshold voltage in fewer than the optimal number of program cycles. If the memory cell programs slowly, the measured count Cm in counter 122 is about equal to the optimal count, and multiplexer 220 selects the default Vdf as the maximum programming voltage during data mode. A count Cm corresponding to a typical memory cell is lower than the optimal count and causes multiplexer 220 to select an intermediate maximum voltage via resistor Rt. A count Cm corresponding to a fast-programming memory cell is much lower than the optimal count and causes multiplexer 220 to select a low maximum voltage via resistor Rf. Lowering the selected maximum voltage increase the number of required program cycles for write operations in the data mode, and thus improves the precision when writing actual data.

Binary converter 230 and voltage divider 240 lowers signal VR from the selected maximum programming voltage VRmax to a programming voltage corresponding to the data value being written. This improves accuracy by programming threshold voltages in smaller steps for lower target threshold voltages, which keeps the count of program cycles near the optimal count.

Figure 2B:
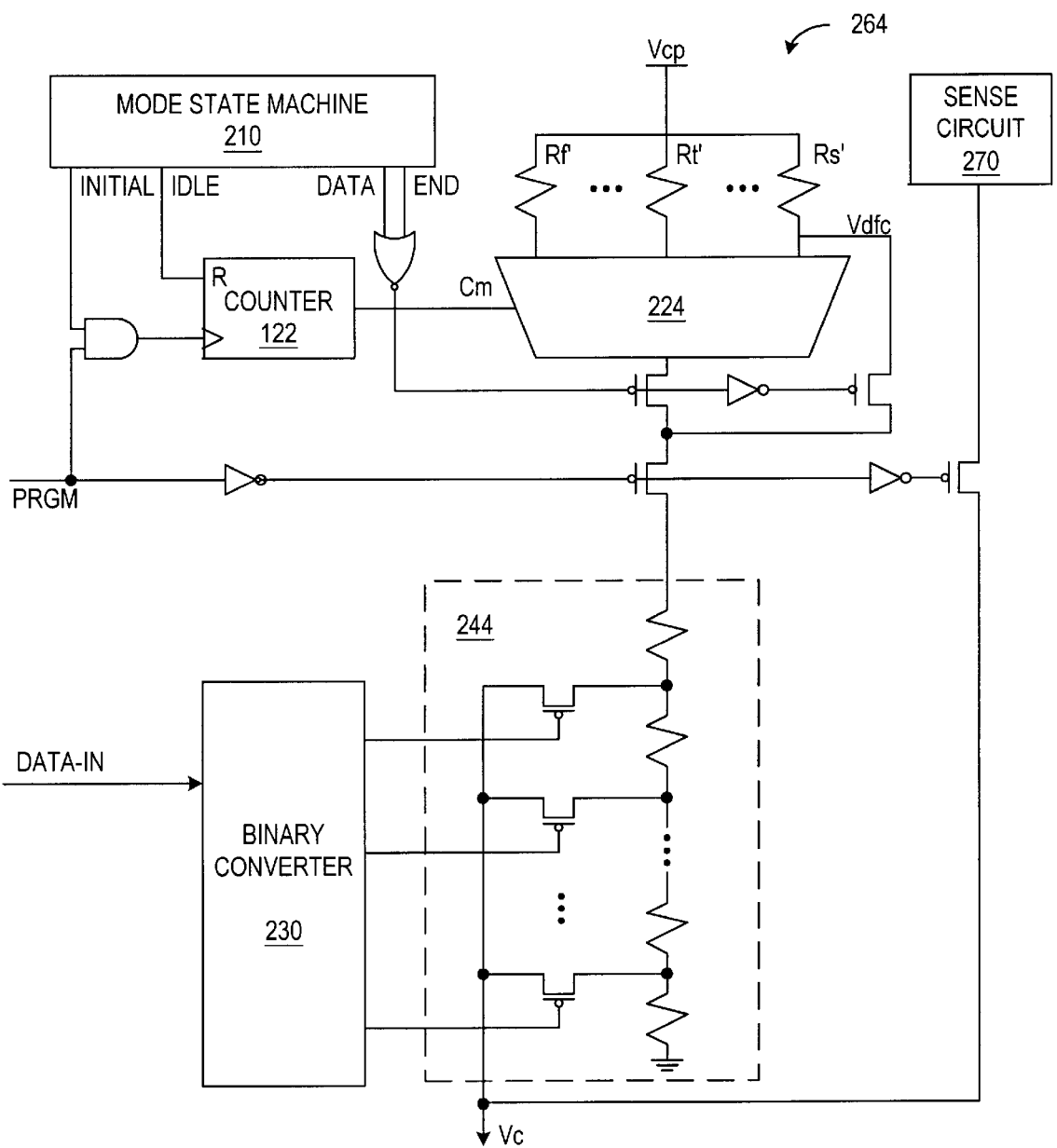

In an alternative embodiment, each write circuit 120 selects a column line programming voltage Vc according to the measured count Cm of program cycles during a write operation. FIG. 2B shows write circuitry 264 that selects voltage Vc according to the programming performance and the data value being written. Write circuitry 264 includes mode state machine 210, counter 122 as described above. A multiplexer 224, voltage divider 244, and associate transistors and resistors are similar to multiplexer 220 and voltage divider 240 of FIG. 2A, but resistors Rf', Rt', and Rs' connect multiplexer 224 to the charge pump voltage Vcp (typically about 6 volts) instead of Vrp (typically about 12 volts). Also, during a verify cycle, a sense circuit connects to the selected column line. Multiplexer 224 selects a lower maximum column line voltage when the count Cm is low. Decreasing the column line voltage decreases change in threshold voltage per program cycle and increases write operation precision.

The write circuits of FIGS. 2A and 2B can be varied greatly without departing from the spirit of the present invention. For example, one or both write circuits 260 and 264 of FIGS. 2A and 2B can be in a memory. Either voltage divider 240 or 244 can be omitted or replaced with alternative circuits. There are many ways to generate the voltages VR and VC. For example, a switched-capacitor implementation can replace the resistor divider 240 or 244 and reduce the DC current drawn from a shared charge pump. Further, the circuits for selecting the programming voltage and the number of choices for the maximum programming voltage can be varied.

Figure 2C:
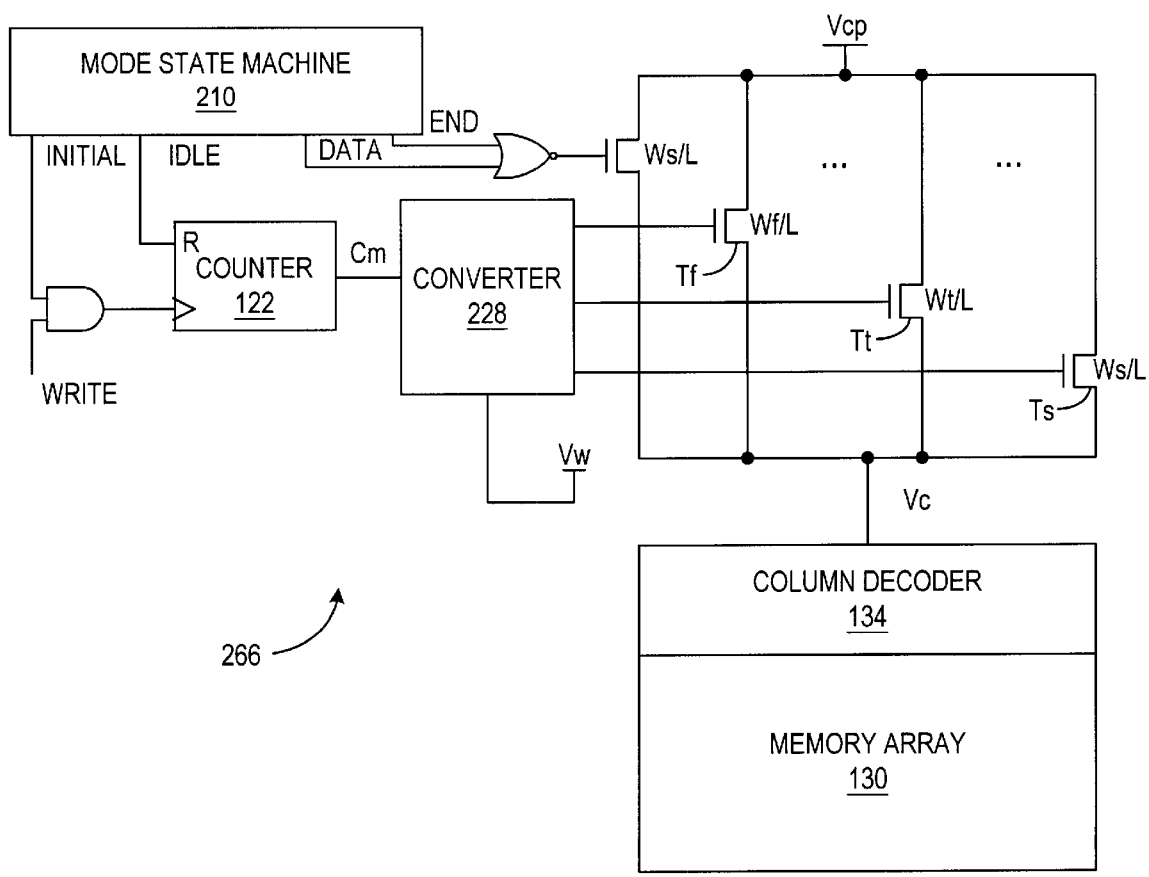

FIG. 2C illustrates a write circuit 266 according to an embodiment of the invention that adjusts the load line resistance according to the programming performance of memory cells. Write circuit 266 includes state machine 210 and counter 122. Counter 122 determines a measured count Cm of program cycles during a dummy write operation as described above. During writing of data a converter 228 converts the count to a digital signal that turns on one of a set of transistors {Tf, ... Tt, ... Ts}. Each of the transistors {Tf, ... Tt, ... Ts} has a different channel width {Wf, ... Wt, ... Ws}. Thus, the load line resistance depends on which of the transistors is on during the program cycles. The load line resistance effectively drops programming voltage Vc when the memory cell draws programming current. The channel width Wf of the transistor Tf used when memory cells program fastest is smallest to slow programming. The channel width Ws of the transistor Ts used when memory cells program slowest is largest. A transistor Tt provides the optimal column line load for a typical memory cell.

In another alternative embodiment, each write circuit 120 selects the duration Tp of each program cycle according to the count Cm in the associated counter 122. In particular, if the measured count Cm for a default time Tp is less than the optimal count Co for the default time Tp, a shorter program cycle time Tp' can be used. With the shorter program cycle time Tp', the change in threshold voltage per program cycle is less, and the required number of program cycles is greater.

Figure 2D:
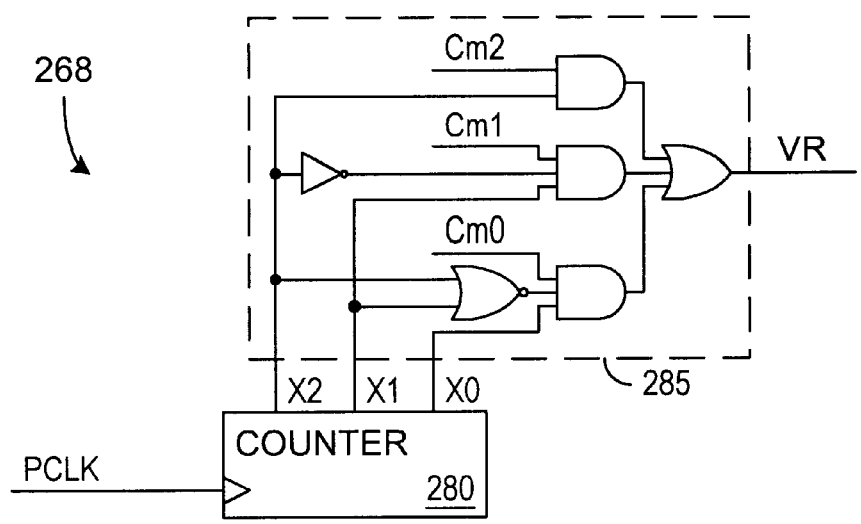
Figure 2E:
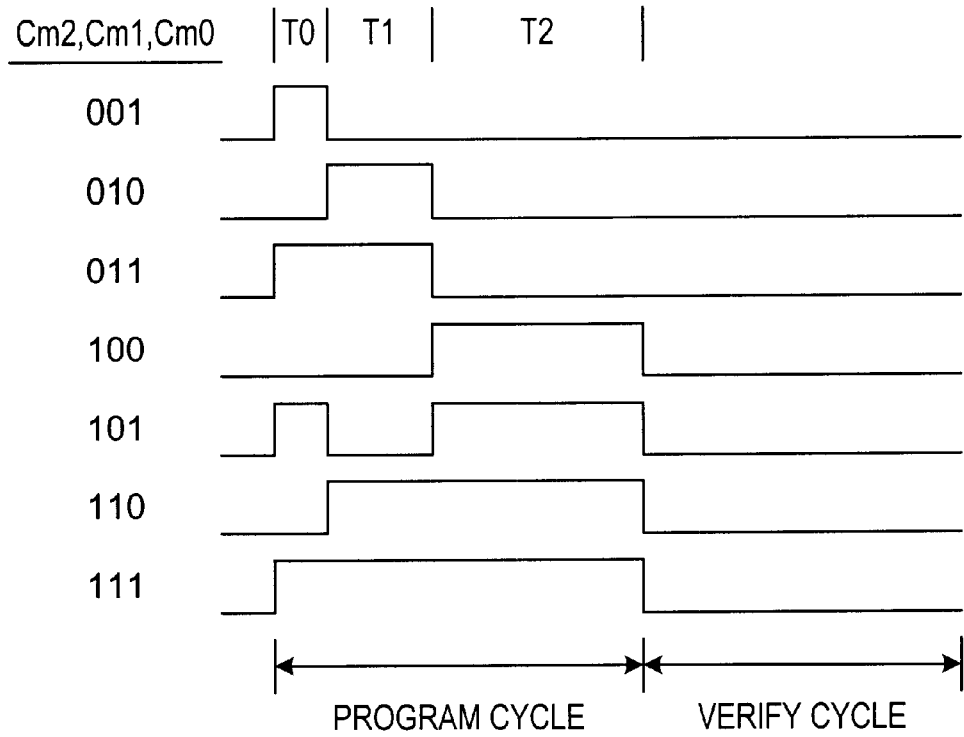
FIG. 2E illustrate wave forms of a row line signal that the write circuit of FIG. 2D generates.

FIG. 2D illustrates write circuitry 268 in accordance with an embodiment of the invention that generates programming pulses in signal VR during each program cycle. In this embodiment, the program cycle has a fixed duration, but the duration of the programming pulse in a program cycle depends on measured count Cm from counter 122. Write circuitry 268 includes a counter 280 and logic 285 that compares three bits Cm0, Cm1, and Cm2 of measured count Cm to a current count X from counter 280. A clock signal PCLK for counter 280 has a period that is about one seventh of the duration of a program cycle. The program cycle is divided into three intervals T0, T1, and T2, which respectively last one, two, and four periods of clock signal PCLK. Circuitry 268 asserts signal VR to the programming voltage level during intervals T0, T1, and T2 if respective bits Cm0, Cm1, and Cm2 of measured count Cm are one. As illustrated in FIG. 2E, the duration of the programming pulse is one to seven periods of clock signal PCLK if bits Cm0, Cm1, and Cm2 represent respective values one to seven.

Another programming parameter that can be adjusted according to the programming response of the memory cells is the mapping between target threshold voltages and data values. For example, if memory cells are quickly programming to high threshold voltage levels, the target threshold voltages corresponding to the data values can be increased. If the memory cells are programming slowly, the target threshold voltages corresponding to data values can be reduced. Effectively, the memory dynamically adjusts the range of target threshold voltages to match the range of threshold voltages that programming can achieve. Such a system can be implemented, for example, by connecting the voltage selection circuitry (e.g., mulitplexer 220 and resistors Rf, Rt, and Rs) of FIG. 2A to verify voltage Vvfy instead of to voltage Vrp so that the voltage of signal VR during a verify cycle depends on the data value being written and count Cm from counter 122. In this embodiment, read circuits 150 must interpret a value read in terms of measured count Cm, and the measure count Cm should be written into non-volatile storage for use during read or playback operations that may be conducted after restarting memory 100.

Figure 3:
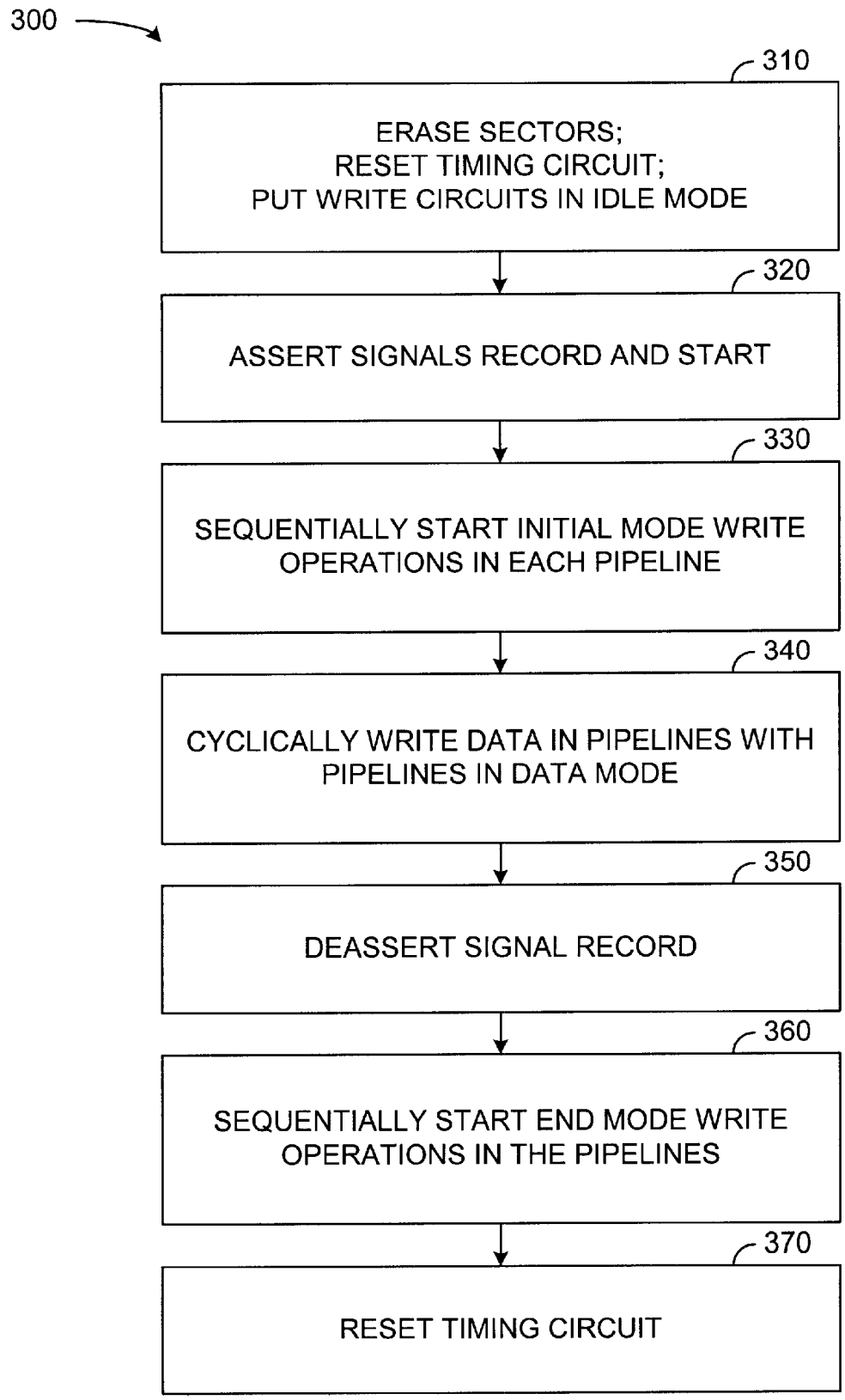
FIG. 3 is a flow diagram of a record operation in accordance with an embodiment of the invention.

FIG. 3 is a flow diagram of a process 300 that records a data stream in the multi-level non-volatile memory 100 (FIG. 1). In an initial step 310, sectors of memory 100 are erased, and timing circuit 140 is reset. All of write circuits 122-1 to 122-N are in the idle mode.

The control circuitry asserts signal RECORD to start the record operation in step 320. In response to signal RECORD, timing circuit 140, in step 330, sequentially starts write operations to dummy cells 136. To avoid loss of data, the assertion of signal RECORD can precede input of a data stream by the time required to complete step 330. Alternatively, data sources 125-1 to 125-N temporarily store incoming data, while write circuits 120-1 to 120-N write dummy values in dummy cells 136-1 to 136-N.

Figure 4:
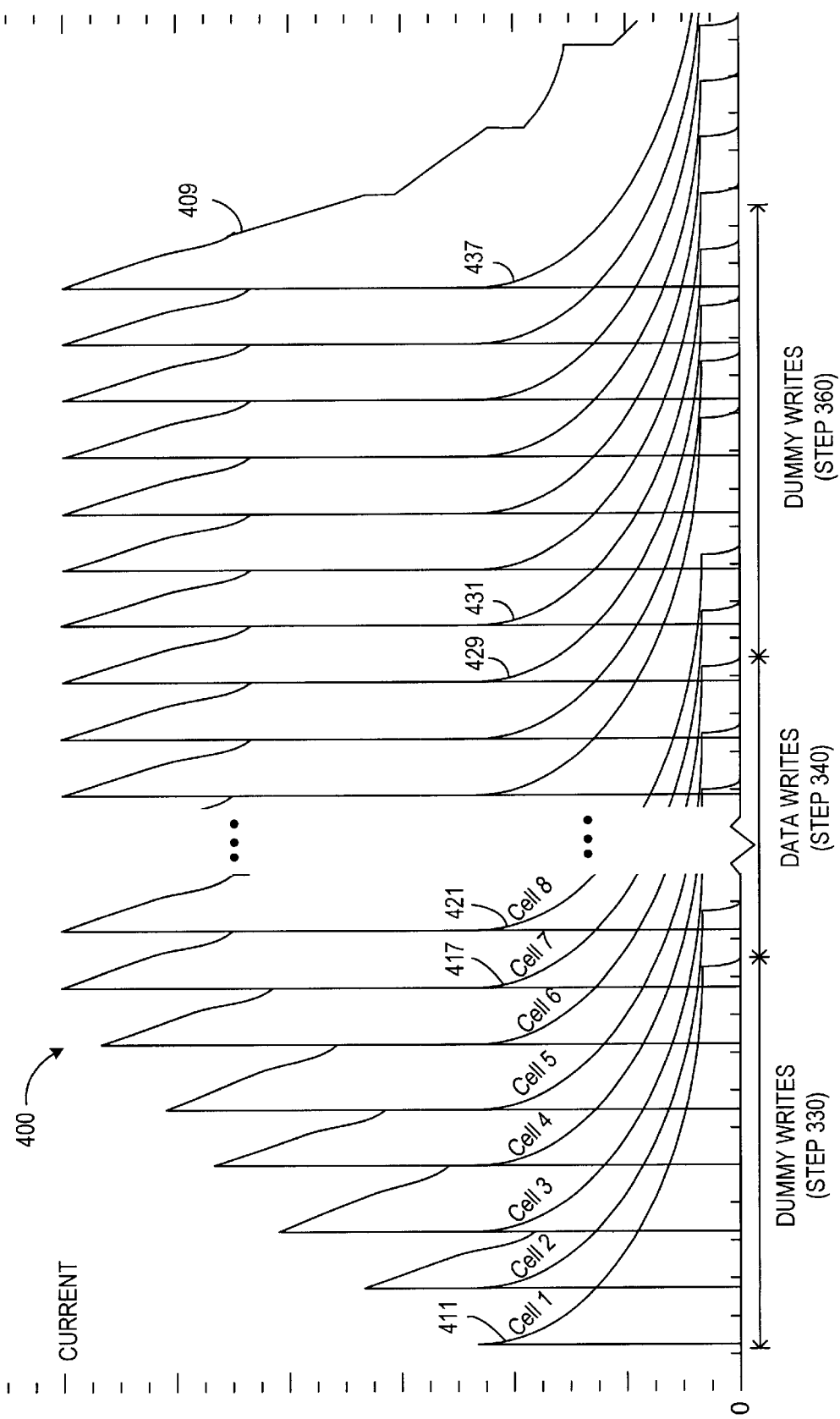
FIG. 4 illustrates the current from a shared voltage supply during a record operation in accordance with an embodiment of the invention.

When timing circuit 140 first asserts signal SR1, pipeline 110-1 starts a write operation, while no other pipelines are performing write operations. When timing circuit 140 first asserts signal SRN, memory 100 has reached a state where each of pipelines 110-1 to 110-N has started a write operation. Accordingly, the total current drawn during the first write operation differs significantly from the current drawn during the Nth write operation. FIG. 4 shows plot 400 of the total current drawn from source 150 during a record operation in a memory having eight pipelines (i.e., N=8). Total current 400 is the sum of currents drawn for separate write operations on dummy cells 136, storage cells 137, and dummy cells 138. The plot of FIG. 4 assumes that each write operation draws a peak current of about 500 $\mu$A and lasts about 11 $\mu$s and that timing circuit 140 starts a new write operation about every 1.6 $\mu$s. The total current 400 increases as more pipelines 110 start write operations until the pipelines are performing an equilibrium number of simultaneous write operations. The write operations are at different stages of completion. In particular, when timing circuit 140 starts a write operation in pipeline 110-N, pipeline 110-1 must have completed or nearly completed its write operation. (Pipeline 110-1 must be ready to start another write operation about one period of clock signal SCLK after pipeline 110-N starts a write operation.)

The minimum number of write operations that step 330 requires depends on the duration of each write operation and the interval between starting consecutive write operations. To optimize write bandwidth, the ratio of the write operation duration to the interval between starts should be about equal to (but slightly less than) N. In which case, step 330 includes at least N−1 write operations that write dummy values. To simplify circuit design, writing an integer multiple of N dummy values may be more convenient.

Two or more dummy values may be written to two or more dummy cells 136 in each array 130 to obtain a more accurate characterization of the memory cells' response to programming. With more than one dummy cell 136 in each memory array 130, the control logic for the pipelines 110 can cyclically select the dummy cells 136 for dummy write operations before selecting any storage cells 137 for writing of data. Counter 122 in each pipeline 110 can measured counts Cm for the dummy write operations. With multiple dummy cells, the counts for all dummy cells may simply accumulate in counter 122 to effectively provide an average count Cm. Alternatively, additional latches (not shown) can temporarily store the counts for writing to individual dummy cells. The count values may the be logically or arithmetically processed to generate one or more "optimum" values for counts Cm. For example, counts for two or more write operations writing the same value can be averaged to obtain an optimum count Cm.

In one embodiment, the possible data values are written to different dummy cells 136 in the same array. The separate counts of program cycles for each dummy write operation of a pipeline 110 indicates how the memory cells in that pipeline respond to programming for the range of data values. The separate counts of program cycles for different possible data values may be averaged or temporarily stored in the latches (not shown) for use in subsequent write operations to the storage cells. For a write operation using multiple stored counts, the data value to be written identifies one of the stored counts, and the write operation uses programming parameters selected according to the identified count.

In step 340, memory 100 cyclically writes data in memory arrays 130-1 to 130-N. As a result of the dummy write operations in step 330, memory 100 reaches a steady state condition of N simultaneous write operations when the first data value is written. Accordingly, the writing of data values in step 340 is not subject to different conditions, resulting from an increasing load as more pipelines 110 begin write operations. As shown in FIG. 4, the total current 400 is the same during each of the data writes. The data writes can use programming parameters selected according to measurements or observations of the write operations on dummy cells 136 in step 330. The programming parameters can be determined individually for each pipeline or globally for all pipelines. Further, the duration can be selected according to individual responses of individual arrays 130 or selected according to a collection of responses from different arrays.

After writing of data is complete, the control circuitry deasserts signal RECORD. In response, pipelines 110, in step 360, sequentially enter the end mode and write dummy values to dummy cells 138. The writing of these dummy values commences while other pipelines write data to storage cells 137. Accordingly, the data mode write operations are not subject to a difference in current draw as more and more of the pipelines 110 complete their respective data write operations. As shown in FIG. 4, a trail off 409 in total current 400 occurs after a final data write operation 429 ends. After completion of the last end mode write operation, the control circuitry resets timing circuit 140 in step 370, and all write operations can end.

As can be understood from the above description, the programming parameters of memory 100 are not fixed through out the life of memory 100. Instead, a record operation can dynamically select the write parameters that give the best precision at the current stage in the life of memory 100. This can increase the usable life of the memory. Since each pipeline 110 programs or erases dummy cells 136 and 138 when programming or erasing the associated storage cells 137, the characteristics of the dummy cells 136 and 138 should track the characteristics of the associated storage cells 137.

Figure 5:
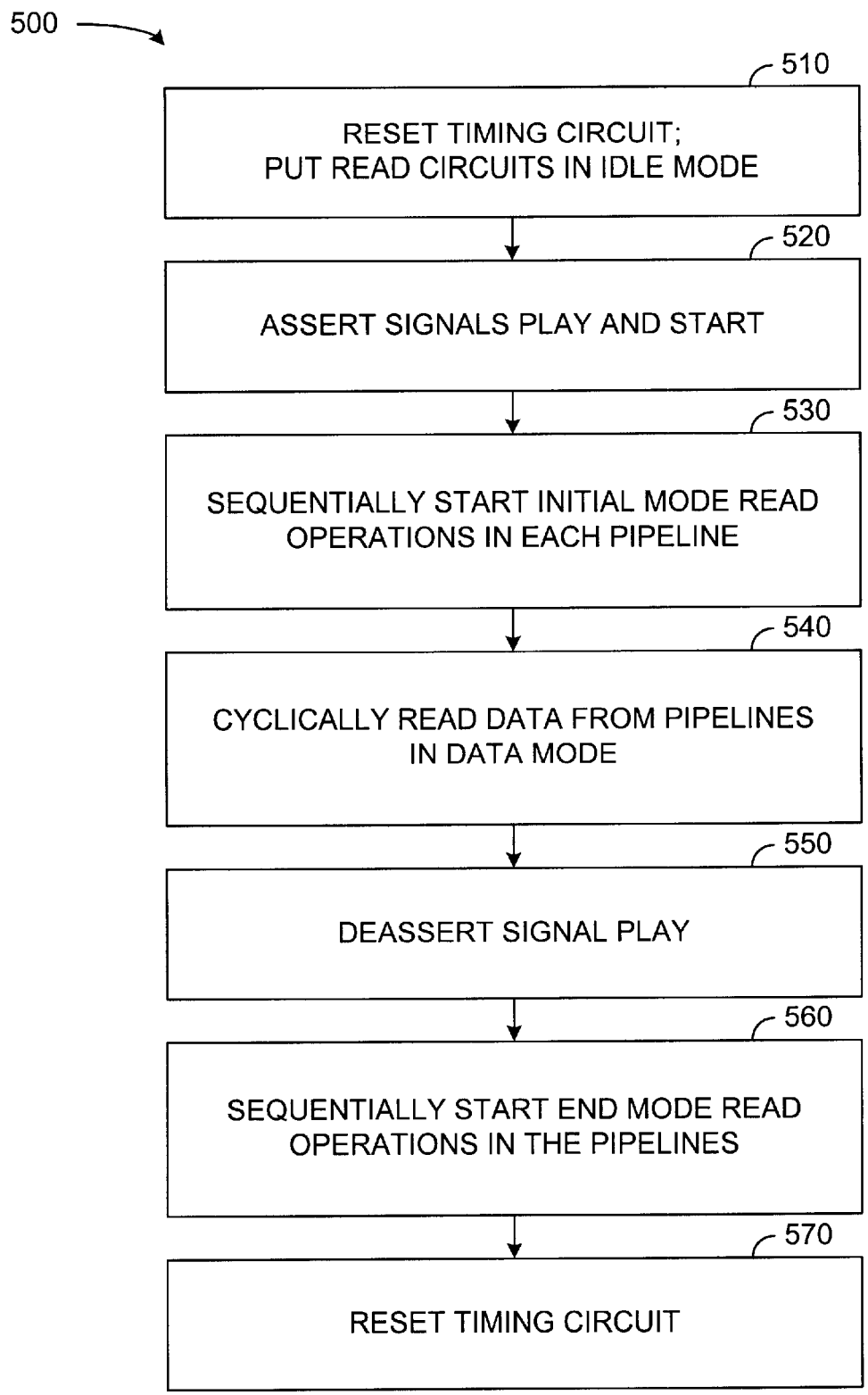
FIG. 5 is a flow diagram of a playback operation in accordance with an embodiment of the invention.

FIG. 5 shows a flow diagram of a playback operation for memory 100. Initially, in step 510, timing circuit 140 is reset, and read circuits 150 are in idle mode. The playback operation starts in step 520 when control circuitry asserts a signal PLAY to read circuits 150 in pipelines 110 and signal START to timing circuit 140. Signal PLAY signifies a read operation, not a write operation. In step 530, timing circuit 140 sequentially starts initial-mode read operations in pipelines 110-1 to 110-N. The initial-mode read operations are dummy accesses, and the values read are not part of an output data stream. Since reading does not significantly disturb stored data, the end-mode read operations can access memory cells including dummy cells 136 or 138 or storage cells 137. Accordingly, a memory lacking dummy cells can conduct a playback operation in accordance with an embodiment of the invention.

After each of pipelines 110-1 to 110-N has started an initial-mode read operation, timing circuit 140 sequentially starts data-mode read operations in pipelines 110-1 to 110-N. The data mode read operations provide the data for the output data stream. As in the record operation described above, the initial-mode read operations stabilize the environment in memory 100 because the data-mode read operations do not start until memory 100 is conducting an equilibrium number of simultaneous read operations.

After the last data-mode read operation is started, the control circuit deasserts signal PLAY (step 550), and timing circuit sequentially starts end-mode read operations. The end-mode read operations are like the initial-mode read operations in that information read is not output to the data stream. Since reading does not significantly disturb stored data, the end-mode read operations can access memory cells including dummy cells 136 or 138 or storage cells 137. The end-mode read operations continue to be started until the last of the data-mode read operations is complete. Accordingly, the data-mode read operations are all conducted while memory 100 conducts a fixed number of simultaneous read operations. Step 570 resets timing circuit 140 after completion of the final end-mode read operation.

Although the invention has been described with reference to particular embodiments, the description is only an example of the invention's application and should not be taken as a limitation. In particular, even though much of preceding discussion was aimed at Flash memories that erase memory cells to a low threshold voltage state and increase a threshold voltage to program a memory cell, alternative embodiments of this invention include other types of non-volatile memory including memories that erase a memory cell to a high threshold voltage state and decrease threshold voltages to program memory cells. Various other adaptations and combinations of features of the embodiments disclosed are within the scope of the invention as defined by the following claims.

We claim:

1. A multi-level non-volatile memory, comprising:

a plurality of pipelines, wherein each pipeline comprises an array of non-volatile memory cells; and circuitry for accessing the non-volatile memory cells in the array; and a timing circuit coupled to the pipelines, wherein for a pipelined I/O operation, the timing circuits sequentially starts the pipelines on accesses, wherein the pipelined I/O operation includes:

a first set of dummy access that the pipelines perform; and a second set of access during which the pipelines access data, a first of the second set of accesses beginning while at least one of the first set of accesses are in progress.

2. The memory of claim 1, wherein the first of the second set of accesses begins in a first of the pipelines while each of the other pipelines is completing an access from the first set.

3. The memory of claim 1, wherein the pipelined I/O operation further comprises a third set of dummy accesses that the pipelines perform, a first of the third set of accesses beginning while at least one of the second set of accesses is in progress.

4. The memory of claim 1, further comprising a shared voltage source coupled to provide a voltage to all of the pipelines for the accesses.

5. The memory of claim 1, wherein the shared voltage source comprises a charge pump that provides a programming voltage.

6. The memory of claim 1, wherein:

the first set of accesses write dummy values to dedicated dummy cells; and the second set of accesses write data to dedicated storage cells.

7. The memory of claim 1, wherein:

the second set of accesses read data that is part of a data stream output from the memory during the pipelined I/O operation; and the first set of accesses read values that are not output from the memory.

8. The memory of claim 7, wherein:

the second set of accesses read data from dedicated storage cells; and the first set of accesses read dummy values from dedicated dummy cells.

9. A pipelined I/O process for a non-volatile memory, comprising:

sequentially starting each of a plurality of pipelines on a corresponding memory access from a first set of memory accesses, wherein in each pipeline, the accesses in the first set has an associated dummy value and accesses a memory cell in an array associated with the pipeline; and sequentially starting each of the plurality of pipelines on an access from a second set of accesses, wherein in each pipeline, the access in the second set has an associated data value and accesses a memory cell in the array associated with the pipeline, wherein a first of the pipelines starts on a first of the accesses in the second set while one or more accesses in the first set are in progress in the other pipelines.

10. The process of claim 9, further comprising supplying a voltage for the first and second sets of accesses from a shared voltage source to all of the pipelines, wherein the first set of accesses stabilizes a current drain on the shared voltage source before the second set of accesses begins.

11. The process of claim 9, further comprising supplying a voltage for the first and second sets of accesses from a shared voltage source to all of the pipelines, wherein the first set of accesses stabilizes a voltage from the shared voltage source before the second set of accesses begins.

12. The process of claim 9, wherein the first set of accesses stabilizes a ground level in the non-volatile memory before the second set of accesses begins.

* * * * *